(12) United States Patent
Tan

(10) Patent No.: US 8,208,251 B2
(45) Date of Patent: Jun. 26, 2012

(54) ELECTRONIC DEVICE AND HEAT DISSIPATION APPARATUS OF THE SAME

(75) Inventor: Zeu-Chia Tan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 99 days.

(21) Appl. No.: 12/871,856

(22) Filed: Aug. 30, 2010

(65) Prior Publication Data

US 2012/0039044 A1 Feb. 16, 2012

(30) Foreign Application Priority Data

Aug. 12, 2010 (TW) ................................ 99126962 A

(51) Int. Cl.
*H05K 7/20* (2006.01)

(52) U.S. Cl. .............. 361/679.47; 361/679.52; 361/688; 361/689; 361/704; 361/715; 165/80.3; 165/104.21; 165/104.26; 165/104.33

(58) Field of Classification Search .............. 361/679.46–679.54, 688–717, 361/721–727; 165/80.2, 80.3, 80.4, 80.5, 165/104.14, 104.21–104.26, 104.33, 104.34, 165/185; 174/16.3, 252; 62/259.2; 257/706–727
See application file for complete search history.

(56) References Cited

U.S. PATENT DOCUMENTS

| 5,815,371 | A | * | 9/1998 | Jeffries et al. | 361/704 |
|---|---|---|---|---|---|
| 6,137,682 | A | * | 10/2000 | Ishimine et al. | 361/704 |
| 6,185,101 | B1 | * | 2/2001 | Itabashi et al. | 361/704 |
| 6,418,018 | B1 | * | 7/2002 | Lo | 361/700 |
| 6,418,021 | B1 | * | 7/2002 | Itabashi et al. | 361/704 |
| 7,019,974 | B2 | * | 3/2006 | Lee et al. | 361/700 |
| 7,319,588 | B2 | * | 1/2008 | Peng et al. | 361/700 |
| 7,327,571 | B2 | * | 2/2008 | Giardina et al. | 361/700 |
| 7,369,412 | B2 | * | 5/2008 | Peng et al. | 361/715 |
| 7,388,752 | B2 | * | 6/2008 | Chang et al. | 361/715 |
| 7,436,667 | B2 | * | 10/2008 | Wu et al. | 361/700 |
| 7,508,667 | B2 | * | 3/2009 | Wu et al. | 361/697 |
| 7,885,063 | B2 | * | 2/2011 | Yu et al. | 361/679.54 |
| 8,018,721 | B2 | * | 9/2011 | Chang et al. | 361/700 |
| 2009/0190303 | A1 | * | 7/2009 | Chu et al. | 361/679.47 |
| 2009/0273904 | A1 | * | 11/2009 | Chung et al. | 361/700 |

* cited by examiner

*Primary Examiner* — Michail V Datskovskiy
(74) *Attorney, Agent, or Firm* — Altis Law Group, Inc.

(57) ABSTRACT

A heat dissipation apparatus is arranged in a housing of an electronic device. The electronic device includes a motherboard mounted in the housing. The heat dissipation apparatus includes a heat dissipation block mounted to an electronic element of the motherboard, a heat sink, a number of pipes connecting the heat sink to the heat dissipation block, and a plate plugged in a socket of the motherboard. The heat sink is mounted to the plate.

11 Claims, 3 Drawing Sheets

ELECTRONIC DEVICE AND HEAT DISSIPATION APPARATUS OF THE SAME

BACKGROUND

1. Technical Field

The present disclosure relates to an electronic device and a heat dissipation apparatus of the electronic device.

2. Description of Related Art

An electronic device, such as a computer or a server, includes a motherboard, a number of electronic elements such as CPUs and memories arranged on the motherboard. A heat sink is usually mounted on the motherboard and attached to the electronic element for heat dissipation, with a bottom of the heat sink. However, if the heat sink is too tall or large, the heat sink is generally not easily mounted in a reliable steady manner only with the bottom of the heat sink, thereby reducing heat dissipation efficiency if the heat sink becomes loose mounted.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
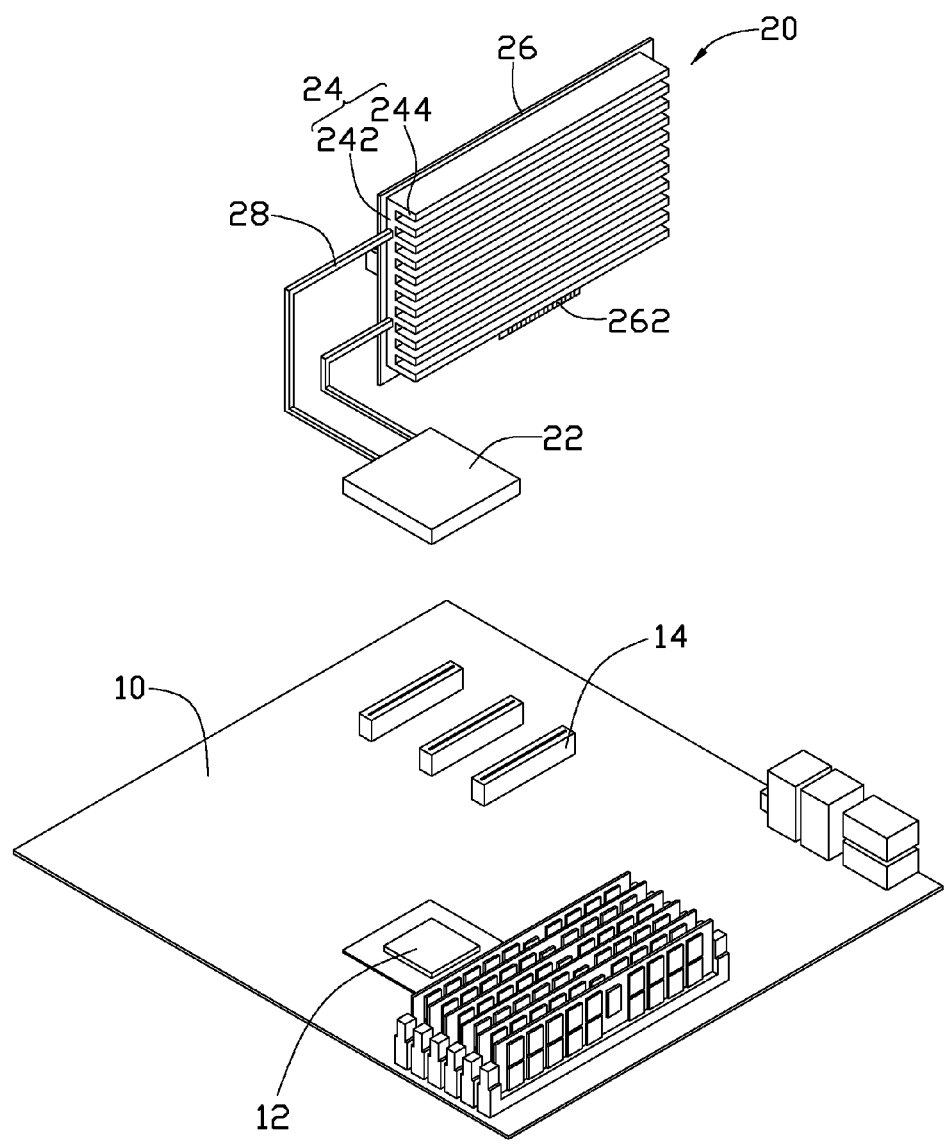
FIG. 1 is an exploded, isometric view of a motherboard and a heat dissipation apparatus.
Figure 2:
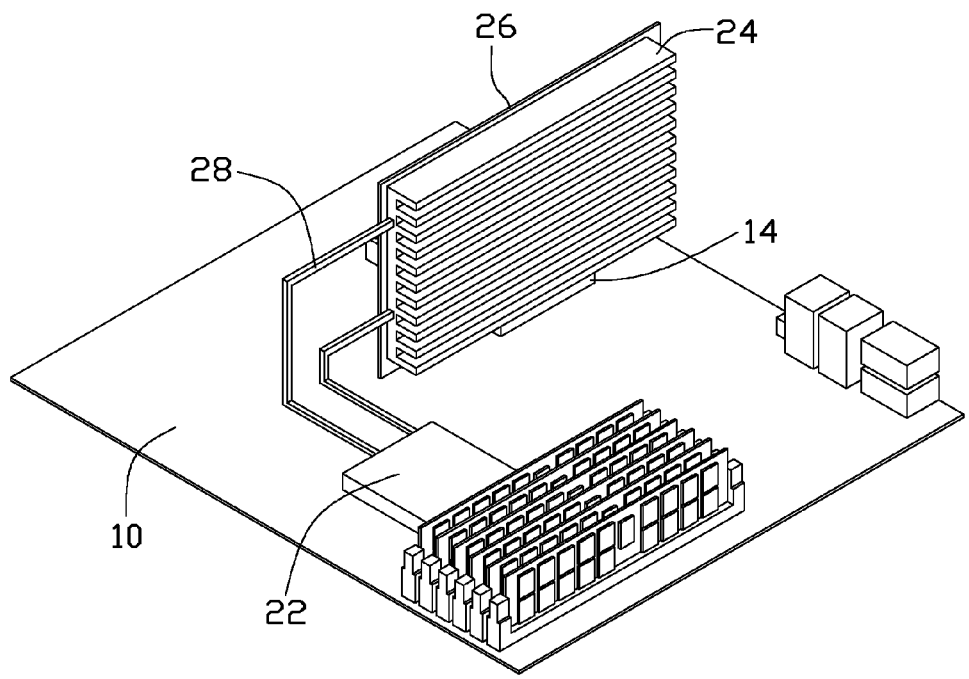
FIG. 2 is an assembled, isometric view of the motherboard and the heat dissipation apparatus of FIG. 1.
Figure 3:
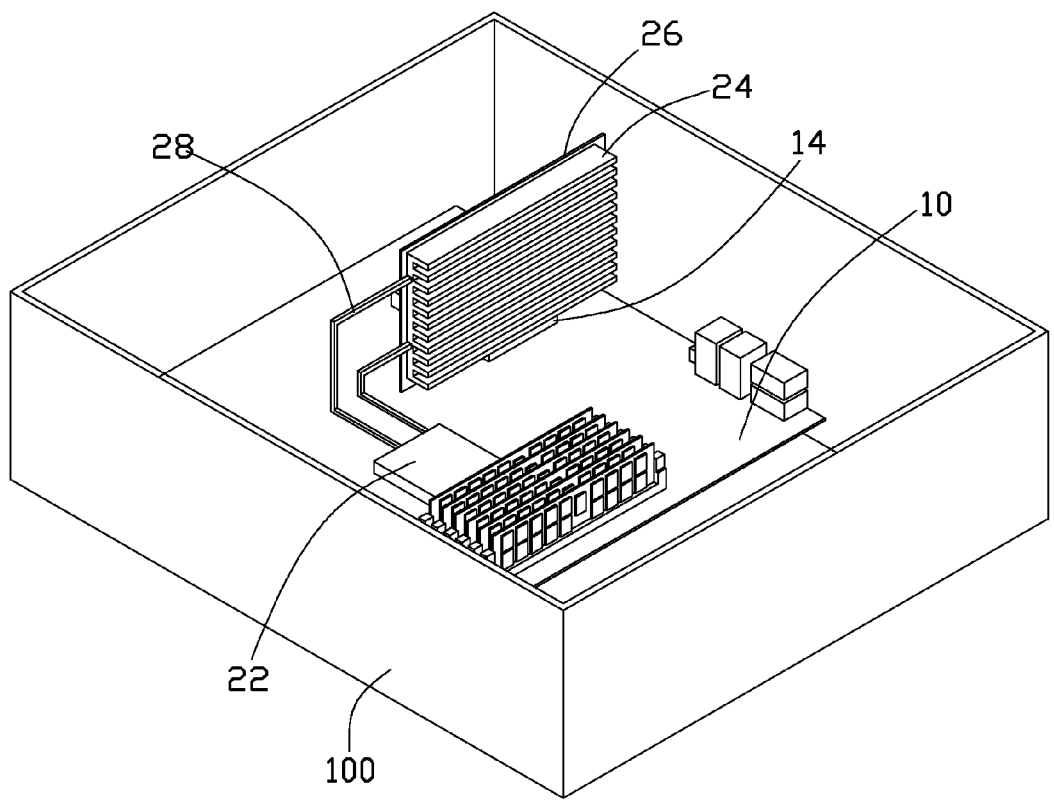
FIG. 3 is an assembled, isometric view of the motherboard and the heat dissipation apparatus of FIG. 2 used in an electronic device.

Referring to FIG. 1 to FIG. 3, an exemplary embodiment of an electronic device includes a housing 100, a motherboard 10 arranged in the housing 100, and a heat dissipation apparatus 20.

An electronic element 12, such as a central processing unit (CPU), is arranged on the motherboard 10. A number of sockets 14 are formed on the motherboard 10 near the electronic element 12, which are used for connecting peripheral component interconnect (PCI) cards.

The heat dissipation apparatus 20 includes a heat dissipation block 22, a heat sink 24, a plate 26 fixed to the heat sink 24, and two heat pipes 28 connecting the heat dissipation block 22 to the heat sink 24. The heat sink 24 includes a base 242, and a number of fins 244 extending from the base 242. The plate 26 includes a plug 262 at a side of the plate 26. The base 242 of the heat sink 24 is attached to the plate 26 by glue or screws. The plate 26 can be a PCI card or a mounting plate. If the plate 26 is a PCI card, the heat sink 24 also can dissipate heat for the PCI card.

In assembly, the heat dissipation block 22 of the heat dissipation apparatus 20 is in tight contact with the electronic element 12, the plug 262 of the plate 26 is plugged in one of the sockets 14 of the motherboard 10. Heat generated by the electronic element 12 is dissipated through the heat dissipation block 22 and the heat pipes 28 to the heat sink 24. In this embodiment, the heat sink 24 is fixed to the plate 26 plugged in one of the sockets 14, therefore the heat sink 24 is steady, even if the heat sink 24 is large and tall.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A heat dissipation apparatus mounted on a motherboard to dissipate heat for an electronic element on the motherboard, the motherboard forming a socket, the heat dissipation apparatus comprising:
   a heat dissipation block mounted to the electronic element;
   a heat sink;
   a plurality of pipes connecting the heat sink to the heat dissipation block; and
   a plate plugged in the socket of the motherboard;
   wherein the heat sink is mounted to the plate.

2. The heat dissipation apparatus of claim 1, wherein the plate comprises a plug for being plugged in the socket of the motherboard.

3. The heat dissipation apparatus of claim 1, wherein the heat sink comprises a base attached to the plate, and a plurality of fins extending from the base.

4. The heat dissipation apparatus of claim 3, wherein the base of the heat sink is attached to the plate by glue or screws.

5. The heat dissipation apparatus of claim 1, wherein the plate is a peripheral component interconnect card.

6. An electronic device comprising:
   a housing;
   a motherboard arranged in the housing, and comprising an electronic element and a socket mounted on the motherboard;
   a heat dissipation apparatus comprising:
   a heat dissipation block mounted to the electronic element;
   a heat sink;
   a plurality of pipes connecting the heat sink to the heat dissipation block; and
   a plate plugged in the socket of the motherboard;
   wherein the heat sink is attached to the plate.

7. The electronic device of claim 6, wherein the plate comprises a plug for being plugged in the socket of the motherboard.

8. The electronic device of claim 6, wherein the heat sink comprises a base attached to the plate, and a plurality of fins extending from the base.

9. The electronic device of claim 8, wherein the base of the heat sink is attached to the plate by glue or screws.

10. The electronic device of claim 6, wherein the plate is a peripheral component interconnect card.

11. The electronic device of claim 6, wherein the socket of the motherboard is a peripheral component interconnect socket.

* * * * *